(12) United States Patent
Kang et al.

(10) Patent No.: US 10,471,705 B2
(45) Date of Patent: Nov. 12, 2019

(54) PRINTING MACHINE

(71) Applicants: BOE TECHNOLOGY GROUP CO., LTD., Beijing (CN); HEFEI BOE DISPLAY LIGHTING CO., LTD., Hefei, Anhui (CN)

(72) Inventors: Yaling Kang, Beijing (CN); Xiaochu Zhang, Beijing (CN); Lanlan Dong, Beijing (CN); Pei Wu, Beijing (CN)

(73) Assignees: BOE TECHNOLOGY GROUP CO., LTD., Beijing (CN); HEFEI BOE DISPLAY LIGHTING CO., LTD., Hefei, Anhui (CN)

( * ) Notice: Subject to any disclaimer, the term of this patent is extended or adjusted under 35 U.S.C. 154(b) by 67 days.

(21) Appl. No.: 15/683,593

(22) Filed: Aug. 22, 2017

(65) Prior Publication Data

US 2018/0099497 A1    Apr. 12, 2018

(30) Foreign Application Priority Data

Oct. 12, 2016    (CN) .......................... 2016 1 0891556

(51) Int. Cl.
*B41F 15/08* (2006.01)
*B41F 9/18* (2006.01)
(Continued)

(52) U.S. Cl.
CPC ............ *B41F 15/0818* (2013.01); *B41F 9/18* (2013.01); *B41F 15/0881* (2013.01);
(Continued)

(58) Field of Classification Search
CPC ............. B41F 15/0809; B41F 15/0818; B41F 15/0881; B41F 15/38; B41F 15/42;
(Continued)

(56) References Cited

U.S. PATENT DOCUMENTS 3,804,011 A * 4/1974 Zimmer ................ B41F 15/426
101/114
4,103,615 A * 8/1978 Cruz ................... B41F 15/0836
101/115
(Continued)

FOREIGN PATENT DOCUMENTS

CN     1625470 A     6/2005
CN     101918218 A   12/2010
(Continued)

OTHER PUBLICATIONS

Translation of Barozzi et al., (JP 2000-225682 A) Rotary Silk Screen Printing Machine, Aug. 15, 2000 (Year: 2000).*
(Continued)

*Primary Examiner* — Leslie J Evanisko
*Assistant Examiner* — Marissa Ferguson-Samreth
(74) *Attorney, Agent, or Firm* — Brooks Kushman P.C.

(57) ABSTRACT

The present disclosure discloses a printing machine. The printing machine includes a carrying platform for carrying a to-be-printed board, a frame above the carrying platform, a roller-shaped screen printing plate with printing graphic meshes, and an ink supply device within the roller-shaped screen printing plate. The roller-shaped screen printing plate is mounted to the frame in a manner that the roller-shaped screen printing plate is capable of rotating relative to the carrying platform.

20 Claims, 3 Drawing Sheets

(51) Int. Cl.
*B41F 15/38* (2006.01)
*H05K 3/12* (2006.01)

(52) U.S. Cl.
CPC .......... *B41F 15/38* (2013.01); *H05K 3/1225* (2013.01); *B41P 2215/112* (2013.01)

(58) Field of Classification Search
CPC ........ B41F 15/44; B41F 15/46; B41F 15/423; B41F 9/18; B41P 2215/112; H05K 3/1225
See application file for complete search history.

(56) References Cited

U.S. PATENT DOCUMENTS

| | | | | |
|---|---|---|---|---|
| 4,106,407 | A * | 8/1978 | Mitter | B41F 15/42 101/120 |
| 5,640,907 | A * | 6/1997 | Tani | B41F 15/0818 101/123 |
| 7,134,389 | B2 * | 11/2006 | Murakami | B41F 15/0836 101/118 |
| 2005/0160925 | A1 | 7/2005 | Stohr | |
| 2013/0298791 | A1 | 11/2013 | Gygi et al. | |
| 2014/0196619 | A1 * | 7/2014 | Kang | B41F 13/12 101/36 |
| 2015/0191005 | A1 * | 7/2015 | Berger | B41M 1/12 101/123 |

FOREIGN PATENT DOCUMENTS

| | | |
|---|---|---|
| CN | 204749478 U | 11/2015 |
| CN | 204774005 U | 11/2015 |
| CN | 105346212 A | 2/2016 |
| CN | 205185511 U | 4/2016 |
| CN | 205395406 U | 7/2016 |
| CN | 206067138 U | 4/2017 |
| JP | 2000225682 A | 8/2000 |

OTHER PUBLICATIONS

First Office Action for Chinese Application No. 201610891556.3, dated May 3, 2017, 5 Pages.
Second Office Action for Chinese Application No. 201610891556.3, dated Jun. 23, 2017, 6 Pages.
Third Office Action for Chinese Application No. 201610891556.3, dated Sep. 1, 2017, 4 Pages.

* cited by examiner

PRINTING MACHINE

CROSS-REFERENCE TO RELATED APPLICATION

This application claims priority to Chinese patent application No. 201610891556.3, filed on Oct. 12, 2016, which is incorporated herein by reference in its entirety.

TECHNICAL FIELD

The present disclosure relates to the field of screen printing technology, and in particular to a printing machine.

BACKGROUND

The principle of the screen printing is that ink can pass through meshes in graphic portions of a screen printing plate but cannot pass through non-graphic portions of the screen printing plate. A screen printing machine generally includes a screen printing plate, a squeegee, an ink tank and a carrying platform. The screen plate is a flat plate and is placed on the carrying platform. The squeegee is located at one side of the screen plate away from the carrying platform. At beginning of starting, ink is poured to one end of the screen printing plate, pressure is applied to the ink at the screen printing plate by moving the squeegee from one end to the other end of the screen printing plate, thereby moving the ink along a surface of the screen printing plate and squeezing the ink out of the meshes in graphic portions. During the process of printing, a gap is kept between the screen printing plate and a printing stock; since a movable line contact is provided between the screen printing plate and the squeegee, and the pressure applied by the squeegee to the screen printing plate can cause a movable line contact between the screen printing plate and the squeegee. Then, the ink is separated from the screen printing plate at the contact line between the screen printing plate and the printing stock and thus is stick to the printing stock, thereby achieving the printing process. Thus, the above printing machine can ensure printing size accuracy, and can prevent the printing stock from being soiled by the ink. However, during the printing process, the screen printing plate works under a certain pressure applied by the squeegee, and thus the screen printing plate is easily damaged.

SUMMARY

The present disclosure provides a printing machine to solve the problem of plate damage which is easily occurred in the printing machine in the related art.

The present disclosure provides the following technical solutions.

A printing machine includes: a carrying platform configured to carry a to-be-printed board; a frame above the carrying platform; a roller-shaped screen printing plate with printing graphic meshes, and the roller-shaped screen printing plate being mounted to the frame in a manner that the roller-shaped screen printing plate is capable of rotating relative to the carrying platform; and an ink supply device in the roller-shaped screen printing plate.

In the above printing machine, since the screen printing plate is roller-shaped and is capable of rotating relative to the carrying platform, a movable line contact is provided between the screen printing plate and the to-be-printed board on the carrying platform. Further, during the printing process, under the action of the gravity, ink supplied from the ink supply device within the screen printing plate can reach a bottom portion of the roller-shaped screen printing plate. Then, the ink flows outside through the printing graphic meshes at the bottom portion, and then is separated from the roller at a contact line between the bottom portion of the roller and the to-be-printed board and thus is stick to a printing stock, thereby achieving the printing process. In the above printing process, since the movable line contact between the screen printing plate and the to-be-printed board is realized without deforming the screen printing plate by force, the problem of plate damage is hardly occurred during the above printing process and thus the above printing machine can solve the problem of plate damage.

Further, the frame includes a rotary shaft, and an axis of the rotary shaft and a shaft axis of the roller-shaped screen printing plate coincide, and the roller-shaped screen printing plate is rotatably mounted to the rotary shaft.

Further, the printing machine further includes a squeegee that is located within the roller-shaped screen printing plate and abuts against an inner wall of the roller-shaped screen printing plate; the squeegee is located at one side of the ink supply device away from an incoming direction of the to-be-printed board.

Further, the squeegee is mounted to the rotary shaft and is parallel to the rotary shaft.

Further, the printing machine further includes a squeegee mounting slider which is located in the roller-shaped screen printing plate and is mounted to the rotary shaft. The squeegee is connected to the squeegee mounting slider.

Further, the squeegee is detachably connected to the squeegee mounting slider.

Further, the squeegee clamps the squeegee mounting slider.

Further, the squeegee mounting slider is disposed around the rotary shaft.

Further, the ink supply device includes a cylindrical ink tank mounted to the rotary shaft, the ink tank is parallel to the ink tank, and the ink tank is provided with a plurality of ink drip holes which are arranged along an extension direction of the ink tank.

Further, the ink supply device further includes an ink mixing rod in the ink tank, and a driving unit for driving the ink mixing rod to move.

Further, the ink mixing rod includes a rod portion and mixing blades mounted on the rod portion.

Further, the driving unit is located at an outside of the ink tank, and is connected with the rod portion.

Further, the carrying platform includes a conveyer belt configured to transfer the to-be-printed board.

Further, the carrying platform is a liftable structure, and the printing machine further includes a controller configured to control lifting movement of the carrying platform.

Further, the carrying platform includes a pressure sensing device for sensing bearing pressure, and the pressure sensing device is in communication with the controller.

Further, the printing graphic meshes are dot holes configured to print dots at light guide plates.

Further, the frame spans across the carrying platform, and the roller-shaped screen printing plate is hung at the frame.

Further, the frame includes a doorframe-shaped frame body spanning across the carrying platform, two spaced supporting arms disposed in the doorframe-shaped frame body, and a rotary shaft on each of the supporting arms; the roller-shaped screen printing plate is rotatably mounted to the rotary shafts and is located between the two supporting arms.

DETAILED DESCRIPTION

In order to make the objects, the technical solutions and the advantages of the present invention more apparent, the present invention will be described hereinafter in a clear and complete manner in conjunction with the drawings. Obviously, the followings are merely a part of, rather than all of, the embodiments, and the other embodiments obtained by a person skilled in the art based on these embodiments, without any creative effort, shall also fall within the scope of the present invention.

Figure 1:
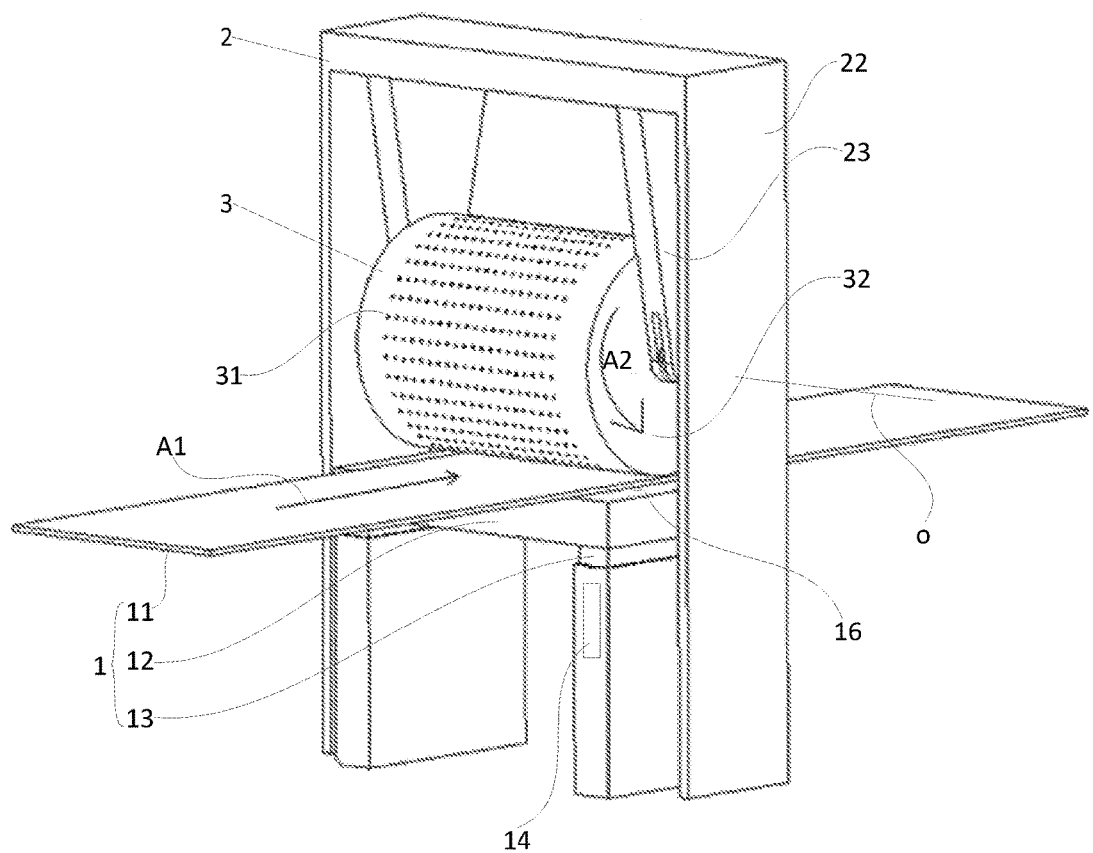
FIG. 1 is a schematic structural view of a printing machine according to an embodiment of the present disclosure.
Figure 2:
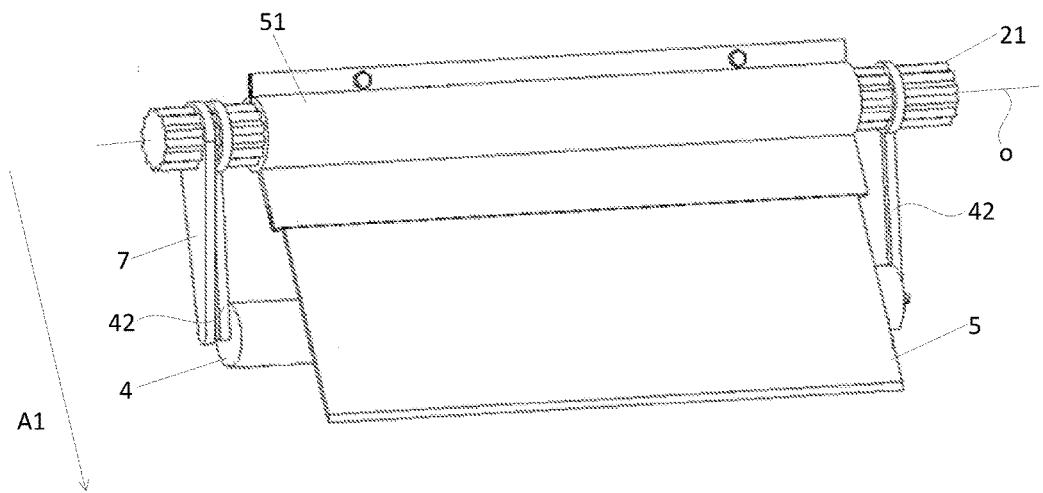
FIG. 2 is a schematic structural view of an ink supply device and a squeegee of the printing machine according to the embodiment of the present disclosure.

Referring to FIG. 1 and FIG. 2, a printing machine according to an embodiment of the present disclosure includes: a carrying platform 1 for carrying a to-be-printed board; a frame 2 located above the carrying platform 1; a roller-shaped screen printing plate 3 with printing graphic meshes 31 provided in a surface thereof, and the roller-shaped screen printing plate 3 being mounted to the frame 2 in a manner that the roller-shaped screen printing plate 3 is capable of rotating relative to the carrying platform 1; and an ink supply device located within the roller-shaped screen printing plate 3.

In the above printing machine, since the screen printing plate 3 is roller-shaped and is capable of rotating relative to the carrying platform 1, a movable line contact is provided between the screen printing plate 3 and the to-be-printed board on the carrying platform 1. Further, since the screen printing plate 3 is roller-shaped, under the action of the gravity, ink supplied from the ink supply device within the screen printing plate 3 can reach a bottom portion of the roller-shaped screen printing plate 3, i.e., a bottom portion of a roller. Then, the ink flows outside through the printing graphic meshes 31 at the bottom portion of the roller, and then is separated from the roller at a contact line between the bottom portion of the roller and the to-be-printed board and thus is stick to a printing stock, thereby achieving the printing process. In the above printing process, since the movable line contact between the screen printing plate 3 and the to-be-printed board is realized without deforming the screen printing plate 3 by force, the problem of plate damage is hardly occurred during the above printing process and thus the above printing machine can solve the problem of plate damage.

As shown in FIG. 1 and FIG. 2, in one embodiment, the above frame 2 for mounting the screen printing plate 3 may include a rotary shaft 21, and an axis of the rotary shaft 21 and a shaft axis of the roller-shaped screen printing plate 3 coincide. The roller-shaped screen printing plate 3 is rotatably mounted to the rotary shaft 21 and is capable of rotating around the rotary shaft 21. Specifically, round bottoms at two sides of the roller-shaped screen printing plate 3 may be sealed by two round bottom plates 32, and the rotary shaft 21 extends through centers of the two round bottom plates 32 and is mounted to a frame body 22 of the frame 2. In an optional embodiment, the frame body 22 of the frame 2 is of a doorframe shape, and the rotary shaft 21 is located within the frame body 22 with two ends of the rotary shaft 21 being fixed to the frame body 22 through supporting arms 23.

Figure 3:
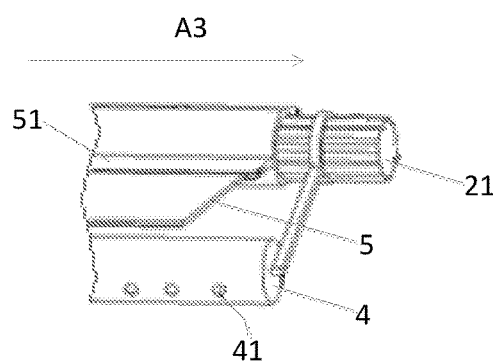
FIG. 3 is a partial schematic structural view of the ink supply device and the squeegee of the printing machine according to the embodiment of the present disclosure.
Figure 5:
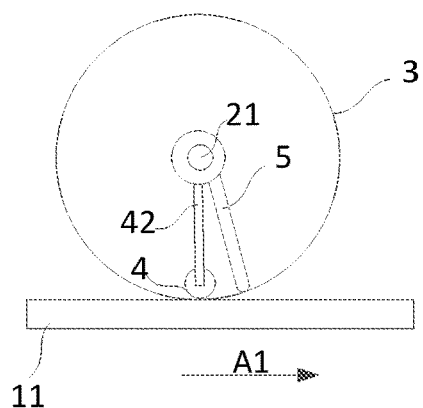
FIG. 5 is a schematic diagram showing position relationship among the ink supply device, the squeegee and a screen printing plate of the printing machine according to the embodiment of the present disclosure.

As shown in FIG. 1 to FIG. 3, in one embodiment, the printing machine may further include a squeegee 5 which is located within the roller-shaped screen printing plate 3 and abuts against an inner wall of the roller-shaped screen printing plate 3 (as shown in FIG. 5). The squeegee 5 is located at one side of the ink supply device. The one side of the ink supply device is away from an incoming direction of the to-be-printed board, i.e., is one side of the ink supply device facing a feeding direction of the to-be-printed board. Since the feeding direction (which is indicated by an arrow A1 shown in FIG. 1) of the to-be-printed board is matched with a rotation direction (which is indicated by an arrow A2 shown in FIG. 1), the presence of the squeegee 5 at one side of the ink supply device facing the feeding direction of the to-be-printed board can blocking ink supplied from the ink supply device from rotating along with the roller, thereby ensuring that there is sufficient amount of ink accumulated at the bottom portion of the roller-shaped screen printing plate 3 and then ensuring ink thickness and printing quality of printing patterns formed through the printing graphic meshes 31.

As shown in FIG. 2 and FIG. 3, in one optional embodiment, the above squeegee 5 may be mounted to the rotary shaft 21 through a squeegee mounting slider 51 mounted to the rotary shaft 21. The squeegee 5 may be detachably connected to the squeegee mounting slider 51 so that the squeegee 5 can be replaced.

As shown in FIG. 2 and FIG. 3, in one optional embodiment, the squeegee 5 is mounted to the rotary shaft 21, and is parallel to the rotary shaft 21. Since the rotary shaft 21 is fixed mounted to the frame body 22 of the frame 2, the squeegee 5 mounted to the rotary shaft 21 as well as the ink supply device are stationary, the roller-shaped screen printing plate 3 can move relative to the squeegee 5 when the roller-shaped screen printing plate 3 rotates around the rotary shaft 21. As a result, the squeegee 5 can shave the inner wall of the roller-shaped screen printing plate 3.

Figure 4:
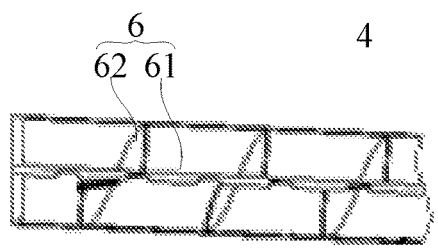
FIG. 4 is a schematic structural view of an internal structure of an ink tank of the printing machine according to the embodiment of the present disclosure.

As shown in FIG. 2 to FIG. 4, in one optional embodiment, the ink supply device may include a cylindrical ink tank 4. The ink tank 4 is parallel to the rotary shaft 21, that is, an extension direction (which is indicated by an arrow A3 shown in FIG. 3) of the ink tank 4 is parallel to an extension direction of the rotary shaft 21. The ink tank 4 is provided a plurality of ink drip holes 41 which are arranged along the extension direction of the ink tank 4. The ink tank 4 is mounted to the rotary shaft 21. Specifically, the ink tank 4 may be fixed mounted to the rotary shaft 21 through two mounting rods 42 which are fixed connected to two ends of the ink tank 4, respectively.

The extension direction of the above cylindrical ink tank 4 is parallel to the extension direction of the rotary shaft 21 and the ink tank 4 is provided with a plurality of ink drip holes 41 which are arranged along the extension direction of the ink tank 4, thus, the ink tank 4 can supply uniform ink along the extension direction of the rotary shaft 21, thereby ensuring that uniform ink is supplied to the contact line between the roller-shaped screen printing plate 3 and the to-be-printed board. As a result, the above ink tank can ensure ink uniformity of the printing patterns.

Figure 6:
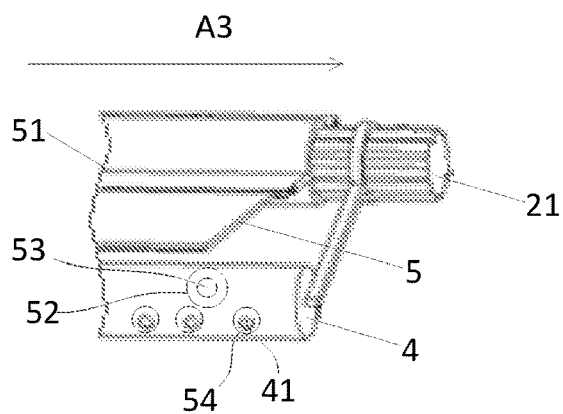
FIG. 6 is a partial schematic structural view of an ink supply device and a squeegee of a printing machine according to another embodiment of the present disclosure.

In an optional embodiment, as shown in FIG. 6, the ink tank 4 is further provided with an inlet 52. The inlet 52 is controlled by a valve 53 to open or close, thereby controlling amount of ink in the ink supply device. Of course, the ink drip holes 41 may also be controlled by valves to open or close, thereby controlling the ink supply device to supply ink. For example, as shown in FIG. 6, a valve 54 may be set in each of the ink drip holes 41, so as to control each of the ink drip holes 41 to open or close, thereby adjusting supplying of ink according to actual needs. The valves 53 and 54 may be selected according to actual needs, for example, they may be selected from micro valves in the related art.

As shown in FIG. 4, in one possible embodiment, the ink supply device may further include an ink mixing rod 6 in the ink tank 4. The ink mixing rod 6 may stir the ink in the ink tank 4 to keep the ink uniform, thereby ensuring the quality of the printing patterns. Optionally, the ink tank 4 is of a cylindrical shape, and the ink mixing rod 6 includes a rod portion 61 and mixing blades 62 mounted on the rod portion 61. An axial line of the rod portion 61 and an axial line of the cylindrical ink tank 4 coincide. The cylindrical shape of the ink tank 4 may help the ink mixing rod 6 to remove blind area, thereby facilitating operation of stirring. Of course, the above ink tank 4 and the ink mixing rod 6 are just one example, and the ink tank 4 and the ink mixing rod 6 of one embodiment are not limited to the above example.

As shown in FIG. 2 and FIG. 4, the ink supply device may further include a driving unit 7 for driving the ink mixing rod 6 to move. Specifically, the driving unit 7 may be located at an outside of the ink tank 4, and is connected with the rod portion 61 of the ink mixing rod 6 to drive the rod portion 61 to rotate around the axial line of the rod portion 61 to rotate, thereby stirring the ink with the ink mixing rod 6.

As shown in FIG. 1, in one embodiment, the carrying platform 1 in the printing machine may further include a conveyer belt 11 for transferring the to-be-printed board. Specifically, a transfer speed of the conveyer belt 11 is matched with a rotation speed of the rotary shaft 21, thereby achieving an automation process of the movable line contact between the screen printing plate 3 and the to-be-printed board.

As shown in FIG. 1, in one embodiment, the carrying platform 1 of the printing machine is a liftable structure. Specifically, the carrying platform 1 may include a bearing table 12 for carrying the to-be-printed board, and a vertical telescopic mechanism 13 for supporting the bearing table 12. The bearing table 12 may be driven to move upwardly or downwardly by telescopic movement of the vertical telescopic mechanism 13. Further, the printing machine of one embodiment may further include a controller 14 which is to control the telescopic movement of the vertical telescopic mechanism 13.

A distance between the to-be-printed board and the roller-shaped screen printing plate 3 can be adjusted by lifting movement of the bearing table 12, and then interaction force and the contact line between the to-be-printed board and the roller-shaped screen printing plate 3 can be controlled, thereby ensuring printing quality.

As shown in FIG. 1, in one embodiment, the carrying platform 1 may further include a pressure sensing device 16 for sensing bearing pressure. The pressure sensing device 16 may be in the bearing table 12 and is in communication with the controller.

The presence of the pressure sensing device can sense pressure on the carrying platform 1, and then the interaction force between the to-be-printed board and the roller-shaped screen printing plate 3 can be obtained. Since the pressure sensing device is in communication with the controller, the interaction force between the to-be-printed board and the roller-shaped screen printing plate 3 can be adjusted according to feedback. Specifically, the pressure sensing device can obtain in time the interaction force between the to-be-printed board and the roller-shaped screen printing plate 3, and send an interaction force signal to the controller. The controller can control the lifting movement of the carrying platform 1 according to the interaction force signal. For example, when the controller determines that the interaction force between the to-be-printed board and the roller-shaped screen printing plate 3 does not meet requirements (for example, the interaction force does not meet requirements for keeping line contact between the to-be-printed board and the roller-shaped screen printing plate 3), the controller controls the carrying platform 1 to move upwardly or downwardly to adjust the interaction force between the to-be-printed board and the roller-shaped screen printing plate 3, thereby causing the interaction force to meet the requirements.

As shown in FIG. 1, in one embodiment, the printing graphic meshes 31 of the roller-shaped screen printing plate 3 may be dot holes for printing dots at light guide plates. Of course, the printing graphic meshes 31 of the roller-shaped screen printing plate 3 are not limited to dot holes, and may be other graphic holes.

The above is only preferred embodiments of the present disclosure, and is not intended to limit the present disclosure. All the changes, equivalent substitutions and improvements in the spirit and principle of the present disclosure should fall within the protection scope of the present disclosure.

What is claimed is:

1. A printing machine, comprising:
  a carrying platform configured to carry a to-be-printed board;
  a frame above the carrying platform;
  a roller-shaped screen printing plate with printing graphic meshes, the roller-shaped screen printing plate being mounted to the frame in a manner that the roller-shaped screen printing plate is capable of rotating relative to the carrying platform; and
  an ink supply device in the roller-shaped screen printing plate;
  wherein the frame comprises a rotary shaft, and an axis of the rotary shaft and a shaft axis of the roller-shaped screen printing plate coincide, and the roller-shaped screen printing plate is rotatably mounted to the rotary shaft;
  the ink supply device comprises an ink tank mounted to the rotary shaft, the ink tank is parallel to the rotary shaft, and the ink tank is provided with a plurality of ink drip holes which are arranged along an extension direction of the ink tank; and
  each ink drip hole comprises a valve, wherein the ink drip holes are controllable by the valves to open or close to control the ink supply device to supply ink.

2. The printing machine of claim 1, further comprising a squeegee that is located within the roller-shaped screen printing plate and abuts against an inner wall of the roller-shaped screen printing plate; and the squeegee is located at one side of the ink supply device away from an incoming direction of the to-be-printed board.

3. The printing machine of claim 2, wherein the squeegee is mounted to the rotary shaft and is parallel to the rotary shaft.

4. The printing machine of claim 3, further comprising a squeegee mounting slider which is located within the roller-shaped screen printing plate and is mounted to the rotary shaft, wherein the squeegee is connected to the squeegee mounting slider.

5. The printing machine of claim 4, wherein the squeegee is detachably connected to the squeegee mounting slider.

6. The printing machine of claim 5, wherein the squeegee mounting slider clamps the squeegee.

7. The printing machine of claim 4, wherein the squeegee mounting slider is disposed around the rotary shaft.

8. The printing machine of claim 1, wherein the ink supply device further comprises an ink mixing rod in the ink tank, and a driving unit for driving the ink mixing rod to move.

9. The printing machine of claim 8, wherein the ink mixing rod comprises a rod portion and mixing blades mounted on the rod portion.

10. The printing machine of claim 9, wherein the driving unit is located at an outside of the ink tank, and is connected with the rod portion in a transmission way.

11. The printing machine of claim 1, wherein the carrying platform comprises a conveyer belt configured to transfer the to-be-printed board.

12. The printing machine of claim 11, wherein the carrying platform is a liftable structure, and the printing machine further comprises a controller configured to control lifting movement of the carrying platform.

13. The printing machine of claim 12, wherein the carrying platform comprises a pressure sensing device configured to sense bearing pressure, and the pressure sensing device is in communication with the controller.

14. The printing machine of claim 1, wherein the printing graphic meshes are dot holes configured to print dots at light guide plates.

15. The printing machine of claim 1, wherein the frame spans across the carrying platform, and the roller-shaped screen printing plate is hung at the frame.

16. The printing machine of claim 1, wherein the frame comprises a doorframe-shaped frame body spanning across the carrying platform, two spaced supporting arms disposed in the doorframe-shaped frame body, and a rotary shaft on each of the supporting arms; the roller-shaped screen printing plate is rotatably mounted to the rotary shafts and is located between the two supporting arms.

17. A printing machine comprising:
a carrying platform configured to carry a to-be-printed board;
a frame above the carrying platform;
a roller-shaped screen printing plate with printing graphic meshes, the roller-shaped screen printing plate being mounted to the frame in a manner that the roller-shaped screen printing plate is capable of rotating relative to the carrying platform; and
an ink supply device in the roller-shaped screen printing plate;
wherein the frame comprises a rotary shaft, the roller-shaped screen printing plate is rotatably mounted to the rotary shaft, the ink supply device comprises an ink tank mounted to the rotary shaft, the ink tank is provided with a plurality of ink drip holes which are arranged along an extension direction of the ink tank, a valve is provided for each ink drip hole, and the valves are controllable to open or close the ink drip holes to control the ink supply device to supply ink.

18. The printing machine of claim 17 wherein each of the valves is positioned in a respective ink drip hole.

19. The printing machine of claim 17 further comprising a squeegee that is located within the roller-shaped screen printing plate and abuts against an inner wall of the roller-shaped screen printing plate; and the squeegee is located at one side of the ink supply device away from an incoming direction of the to-be-printed board.

20. The printing machine of claim 19 wherein the squeegee is mounted to the rotary shaft and extends parallel to the rotary shaft.

* * * * *